United States Patent [19]
Kunkel et al.

[11] Patent Number: 5,124,019
[45] Date of Patent: Jun. 23, 1992

[54] LENS HOLDER FOR USE IN A HIGH-VACUUM VAPOR DEPOSITION OR SPUTTERING SYSTEM

[75] Inventors: Georg Kunkel, Heigenbruecken; Dieter Klingenstein, Erlensee; Heinz Mahr, Buedingen; Michael Fliedner, Bruchkoebel, all of Fed. Rep. of Germany

[73] Assignee: Leybold Aktiengesellschaft, Fed. Rep. of Germany

[21] Appl. No.: 456,472

[22] Filed: Dec. 26, 1989

[30] Foreign Application Priority Data

Jul. 1, 1989 [DE] Fed. Rep. of Germany ....... 3921671

[51] Int. Cl.$^5$ ..................... C23C 14/24; C23C 14/34; C23C 14/50
[52] U.S. Cl. ............................. 204/298.15; 118/729; 118/731
[58] Field of Search .................. 204/298.15; 118/728, 118/729, 731, 500, 503; 269/202, 207, 254, 287

[56] References Cited

U.S. PATENT DOCUMENTS

| | | | |
|---|---|---|---|
| 4,473,455 | 9/1984 | Dean et al. | 204/298.15 |
| 4,592,308 | 6/1986 | Shih et al. | 118/726 |
| 4,735,701 | 4/1988 | Allen et al. | 204/298.15 |

FOREIGN PATENT DOCUMENTS

| | | |
|---|---|---|
| 0215261 | 3/1987 | European Pat. Off. |
| 3715831 | 2/1988 | Fed. Rep. of Germany |
| 2159541 | 12/1985 | United Kingdom |

OTHER PUBLICATIONS

J. W. Brossman et al., Apparatus for Depositing Material on Both Side of Semiconductor Slices, Western Electric, Technical Digest No. 7, Jul. 1967, pp. 7-8.

*Primary Examiner*—John Niebling
*Assistant Examiner*—William T. Leader
*Attorney, Agent, or Firm*—Hill, Van Santen, Steadman & Simpson

[57] ABSTRACT

A lens holder, particularly for eyeglass lenses to be coated in a high-vacuum vapor deposition or sputtering system, is formed as a ring pair. The ring pair is connectable to a substrate holder that is mounted in the process chamber of the high-vacuum system in the proximity of a coating source. The lens can be placed between the rings of the ring pair, which are secured to one another by resilient wires. An outer surface of a first ring is provided with ramps that interact with resilient wires that are secured to the outer surface of a second ring. One of the rings includes two diametrically opposite pegs which serve to pivotably mount the lens holder in bearing forks mounted on the substrate holder. The lens holder is capable of 180° of rotation.

6 Claims, 4 Drawing Sheets

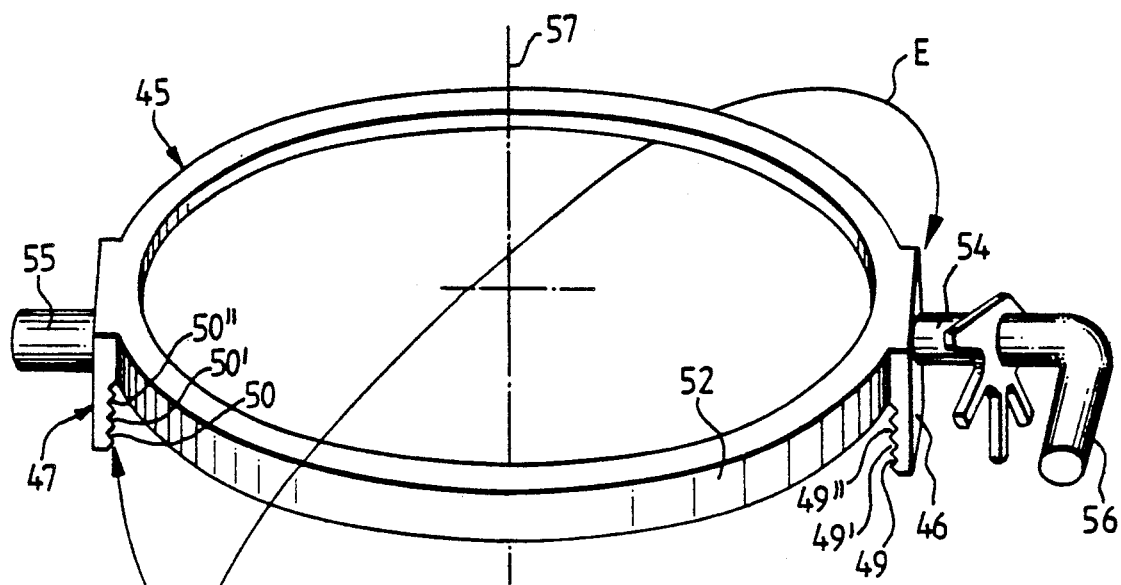
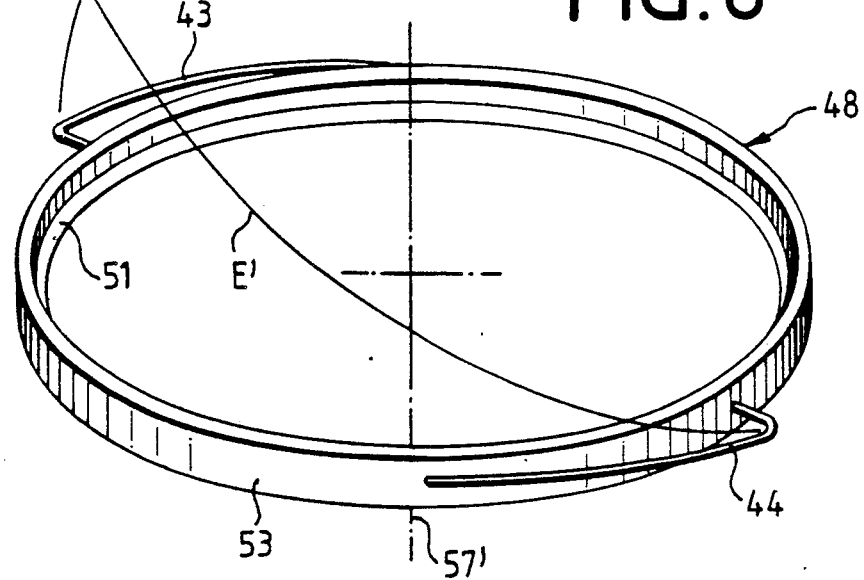

LENS HOLDER FOR USE IN A HIGH-VACUUM VAPOR DEPOSITION OR SPUTTERING SYSTEM

TECHNICAL FIELD

The invention is directed to a lens holder, particularly to a holder for eyeglass lenses to be coated in a high-vacuum vapor deposition or sputtering system. More specifically, the invention relates to a ring shaped lens holder that is connectable to a carrier plate that is held in the proximity of a coating source inside the process chamber of a high vacuum system.

BACKGROUND OF THE INVENTION

German OS 37 15 831 shows a vacuum coating system for vapor deposition of anti-reflection coating layers on optical substrates such as lenses for plastic eyeglasses. The lenses can be clamped on a carrier that rotates in an evacuatable chamber above a vaporization source. The carrier is formed by a plurality of planar carrier plates which are arranged and supported to approximate a portion of a sphere, each of which is capable of at least 180° of rotation relative to the other plates. Every carrier plate includes a plurality of openings in which are mounted substrate holders including at least one retaining spring. The substrate holders are freely tiltable, from both sides, out of the plane of the carrier plate up to a predetermined angle. Thus, every substrate holder includes a resilient and freely tiltable mount secured to the carrier plate.

European Patent No. 215 261 teaches a lens holder for eyeglass lenses to be cleaned and subsequently coated. The lens holder is fashioned as a ring having an interior surface from which extends a plurality of notched projections which accept the lenses to be held. The ring is elastically deformable, and the notched projections are arranged generally opposite one another.

SUMMARY OF THE INVENTION

It is therefore an object of the present invention to provide a space-efficient lens holder that permits an especially fast interchange of lenses and turning of the lens relative to the coating source. The lens holder retains the lens on its outside edges, and provides a constant distance between the lens and the coating source, regardless of which way the lens is turned.

This and other objects are inventively achieved by providing a lens holder wherein the lens is placed between two rings that are secured to one another via resilient tongues or arms. The first ring has an outside generated surface provided with structure (e.g. cams, ramps, connecting links, or tabs) extending axially from the ring and including inside channels. The inside channels interact with resilient tongues or arms that are secured to, and extend generally along, an outer surface of a second ring.

Preferably, at least one of the two rings includes a channel, a bezel, or radially inwardly extending projections on its inner surface, on which the outer edge of the lens is supported.

To facilitate fast turning of the lens holder, at least one of the rings includes two diametrically opposed pegs or fingers on its outer surface. The substrate carrier includes bearing forks corresponding to and pivotably supporting the pegs or fingers.

In a preferred embodiment, one of the rings has at least two channels provided on its outer surface. The channels lie diametrically opposite one another, and extend longitudinally at an angle of about 30° relative to the rotational axis of the ring. The other ring is provided with resilient wire projections having one end firmly soldered, welded, or riveted to the ring, and another end bent to form a bight or loop that extends in a plane parallel to that of the channels on the first ring.

At least one of the pegs includes a cam or finger that interacts with a pair of magnets located near the bearing fork on the substrate carrier. The finger and magnets interact to insure that the lens holder assumes only two positions, and is stable with respect to undesired rotational or turning movements.

Other objects and advantages of the present invention will become apparent upon reference to the accompanying description when taken in conjunction with the following drawings.

BRIEF DESCRIPTION OF THE DRAWINGS

FIGS. 7 and 8 are perspective views of rings showing another embodiment of the present invention.

DETAILED DESCRIPTION OF THE PREFERRED EMBODIMENTS

Figure 1:
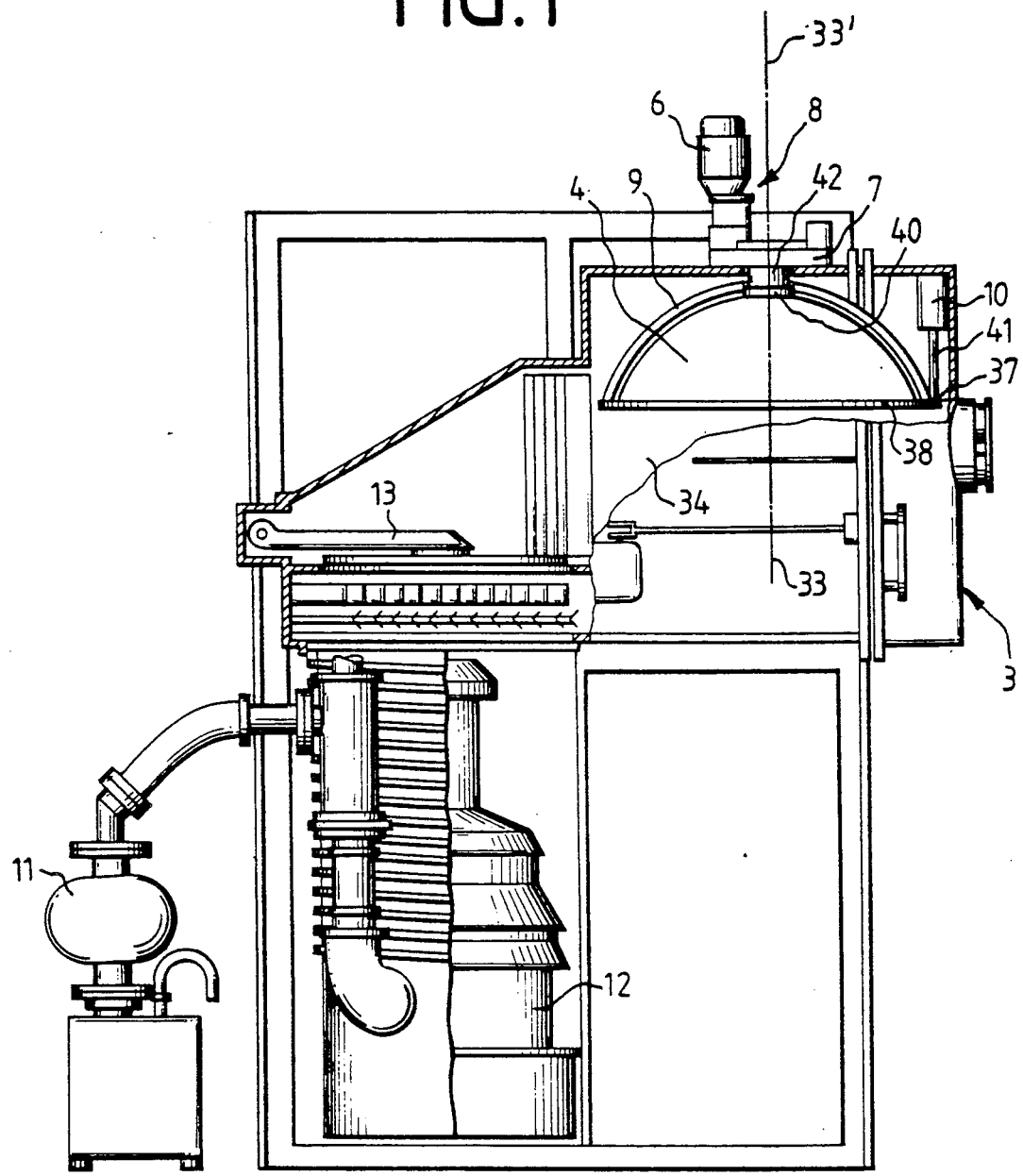
FIG. 1 is a part-sectional view of a high-vacuum vapor deposition system in which the present invention is employed.

The high-vacuum vapor deposition system shown in FIG. 1 includes a housing 3 including a process chamber 34 having a vaporization source arranged therein. Also in the chamber 34 is a part spherical substrate holder 4. The substrate holder 4 is rotatable around vertical axis, and includes a drive unit 8 including a motor 6 having gearing 7, and a slide or rake 9 having a lifting motor 10. The vapor deposition system also includes a backing pump unit 11, a diffusion pump 12 and a vacuum valve 13.

Figure 2:
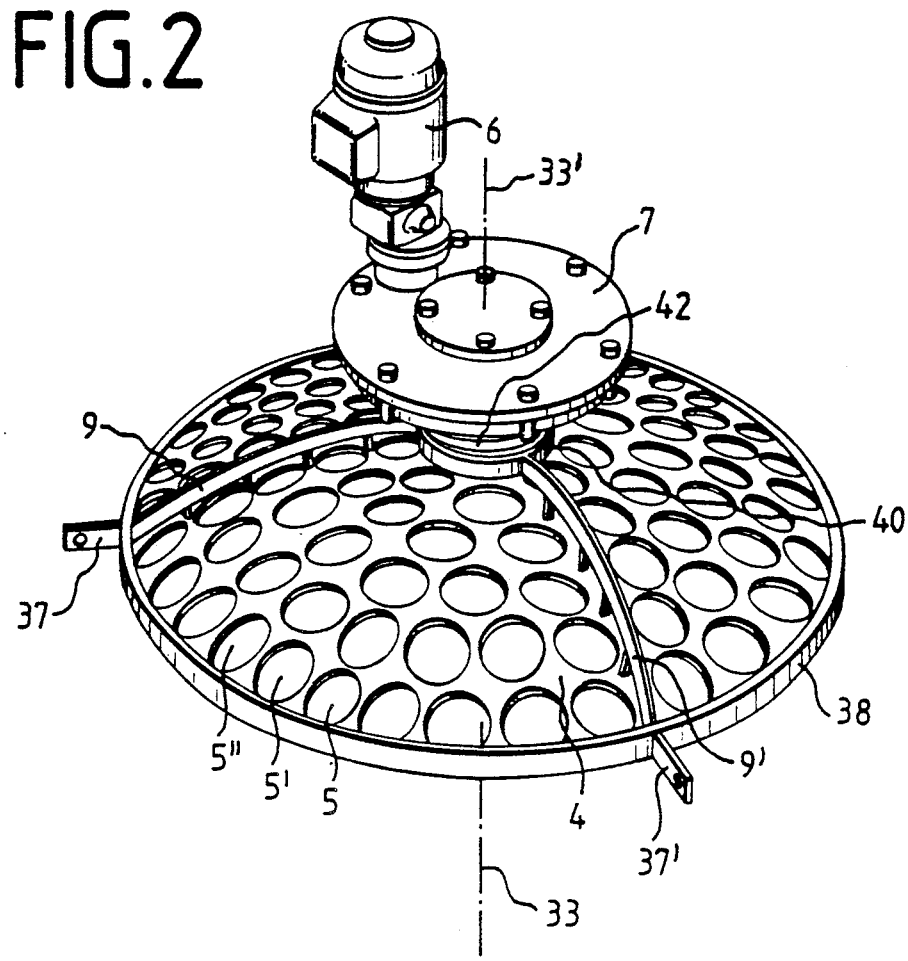
FIG. 2 is a perspective view of a part spherical substrate carrier.

Part of the substrate holder 4 includes a sheet metal blank provided with a plurality of openings 5, 5', best seen in FIG. 2.

Figure 3:
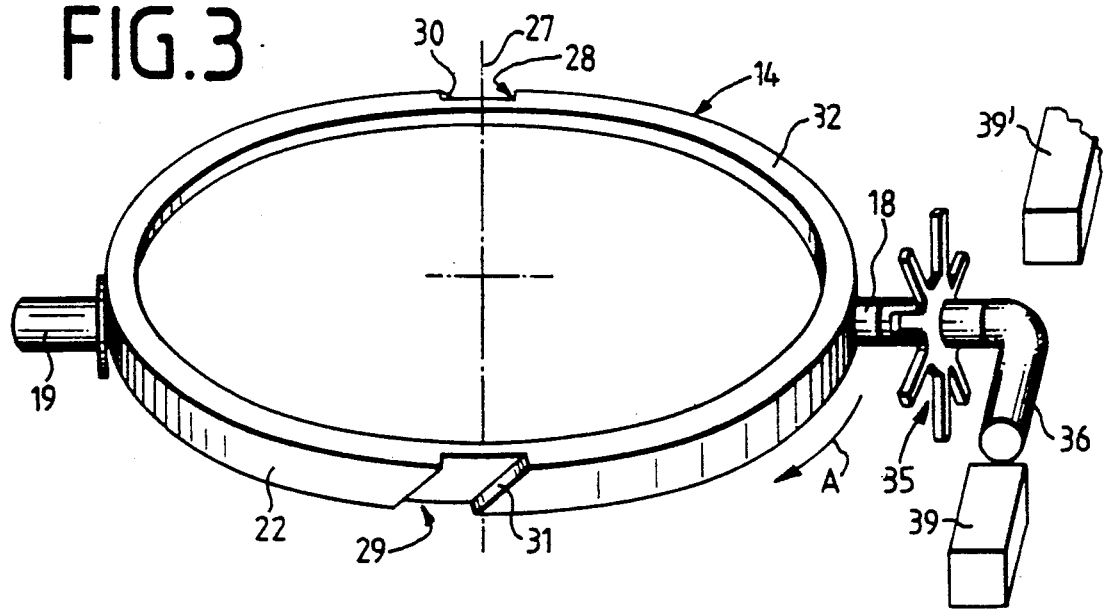
FIGS. 3 and 4 are schematic perspective views showing one embodiment of the respective rings forming a part of the present invention.
Figure 4:
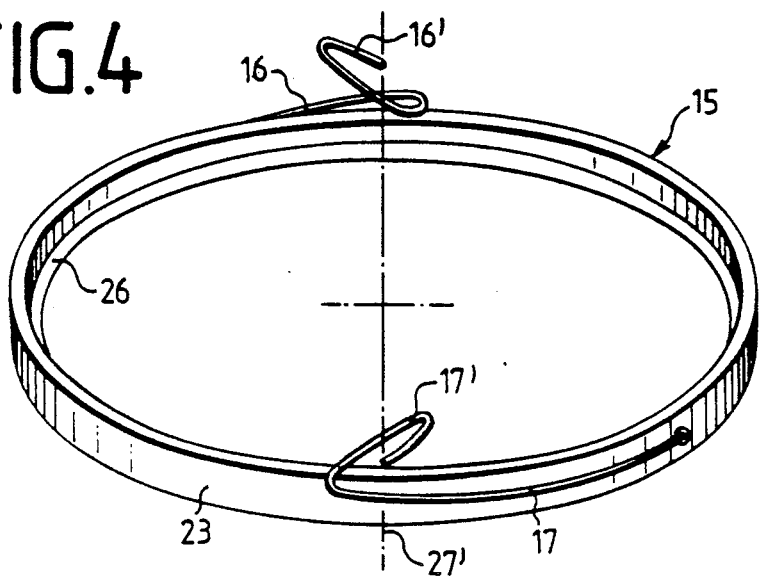
Figure 5:
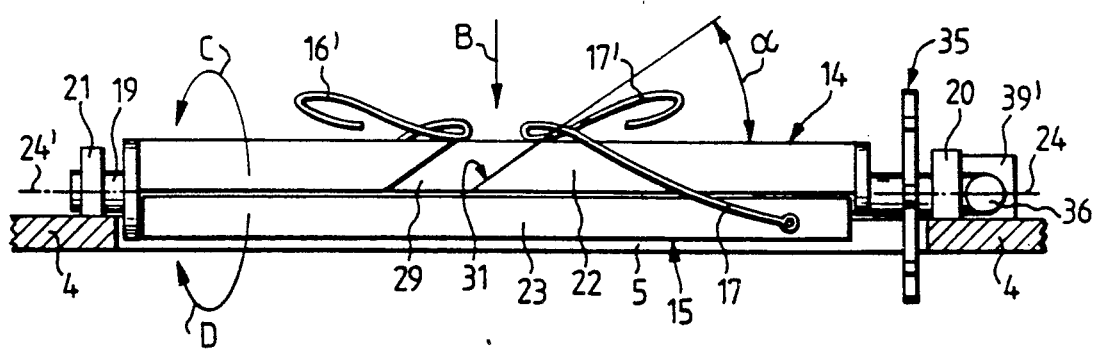
FIG. 5 is a side sectional view of the rings of FIGS. 3 and 4 assembled together.

The openings 5' in the substrate holder 4 serve the purpose of receiving ring pairs 14, 15, as shown in detail in FIGS. 3 through 5. The ring pairs 14, 15 are connected to one another with wire springs 16, 17 and include pegs 18, 19 that can be inserted into bearing forks 20, 21 located on the surface of the substrate holder 4 near the edges of the openings 5, 5'. In the embodiment shown in FIGS. 3 and 5, two pegs 18, 19 lie diametrically opposite one another on the outside surface 22 of the ring 15. The pegs 18, 19 are mounted such that the rotational axis 24, 24' of the lens holder lies roughly in the contacting plane of the rings 14, 15.

The ring 14 has an outer surface 22 into which extend two diametrically opposite channels 28, 29. The channels 28, 29 include inclined ramp surfaces 30, 31 that lie at approximately a 30° angle to a circumferential plane passing through an upper side 32 of the ring 14.

Figure 6:
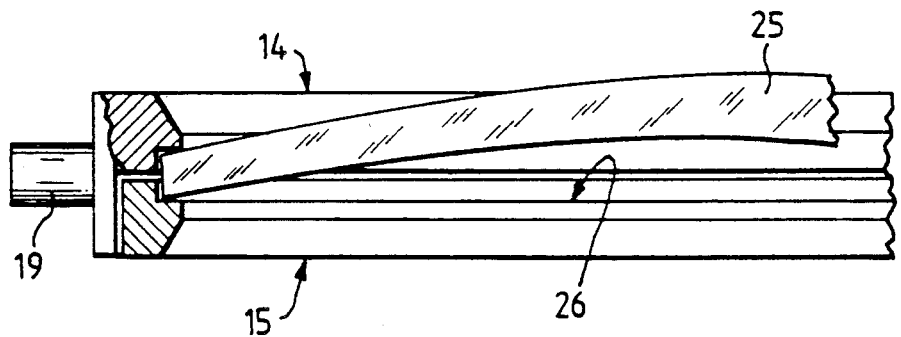
FIG. 6 is a sectional detail, partly broken away, showing a lens mounted between two rings.

The ring 15 includes a pair of wire springs 16, 17 extending from an outer surface 23 thereof. The wire springs 16, 17 include respective resilient ends in the form of a loop or bight 16', 17' that are disposed at an angle approximately corresponding to that of the channels 28, 29. The ring 15 further includes a flanged step 26 that is capable of receiving an eyeglass lens 25 (FIG. 6).

In order to place the eyeglass lens 25 into the rings 14, 15 and subsequently join the rings 14, 15 to one another, the eyeglass lens 25 is placed on the flanged step 26 of the ring 15. The ring 14 is then placed onto the ring 15 from above, such that the transverse axes 27, 27' of the rings 14, 15 are aligned. Next, the ring 14 is turned relative to the ring 15 in the direction of arrow A (FIG. 3) until the ends 16', 17' of the wire springs 16, 17 slide into the channels 28, 29. With continued turning, the ends 16', 17' slide along the ramps 30, 31 until they lie on the upper surface 32 of the first ring 14. In this position, the resiliency of the wire springs 16, 17 retains the two rings 14, 15 together with the eyeglass lens 25 lying therebetween.

Having been clipped together, the two rings 14, 15 are positioned in the direction of arrow B (FIG. 5) so that they are situated in the fork shaped or U-shaped bearing forks 20, 21. The outside diameter of the rings 14, 15 and the inside diameter of the openings 5, 5' are selected such that the ring pair 14, 15 can be turned in the direction of arrows C or D around the rotational axis 24, 24'. Thus, the lens 25 is pivotable between two rotational positions, so that each side of the lens 25 may be coated.

The turning or swiveling motion of the ring pairs 14, 15 may be accomplished with the systems of a rake 9 in the housing 3 when the process chamber 34 is closed. The rake 9 is formed as a semi-circular sheet metal blank. When the substrate holder 4 rotates about the axis 33, 33', the rake 9 sweeps over the upper side of the substrate holder 4. The tines of the rake 9 come into contact with teeth of a gear wheel 35 arranged on the peg 18 of the ring 14. The rake remains in contact with the gear wheel 35 until the ring pair 14, 15 has turned 180° around the axis 24, 24'. The peg 18 includes a finger 36 can be retained in position by one of a pair of magnets 39, 39' arranged on the upper side of the substrate holder 4. The magnets 39, 39' retain the finger, and thus the ring pair, in one of two desired rotational positions, and ensure that the ring pair 14, 15 does not remain in an unstable intermediate position.

The interaction of the rake 9 with the gear wheels 35 effects a swivel motion of the respective ring pairs 14, 15, thus allowing the eyeglass lenses 25 to be turned during the coating process when the chamber 34 is closed. Selective actuation of the rake 9 or plurality of rakes 9, 9' is provided by a separate lifting motor 10 having a lifting member 41 and a mounting piece 37. The mounting piece 37 is hinged to a coupling ring 38 that connects a plurality of rakes 9, 9' to one another. The other end of the rakes 9, 9' are connected to one another at a lifter ring 40 that is displaceably held and guided on the bearing tube 42 of the drive unit 8.

In an alternative embodiment shown in FIGS. 7 and 8, the ramps 30, 31 and channels 28, 29 are replaced by two tabs 46, 47 extending downwardly from a ring 45 in a direction parallel to the axes 57, 57' toward a second ring 48. Each of the tabs is provided with recesses or channels 49, 49' or 50, 50' that face toward one another. These channels or recesses interact with resilient wire projections 43, 44 that are secured to the outer surface 53 of the ring 48. After an eyeglass lens is placed on a flange shaped step 51 of the ring 48, the ring 48 is turned in the direction of arrows E, E' so that the projections 43, 44 engage the channels of the tabs 46, 47. A plurality of channels 49, 49', 49" and 50, 50', 50" are axially spaced from one another and may be selected dependent upon the thickness of the eyeglass lens to be coated.

Although the present invention has been described with reference to a specific embodiment, those of skill in the art will recognize that changes may be made thereto without departing from the scope and spirit of the invention as set forth in the appended claims.

We claim:

1. A lens holder for eyeglass lenses to be coated in a high-vacuum vapor deposition or sputtering system, said holder being connectable to a substrate holder that is held in a process chamber of said high-vacuum system in the proximity of a coating source, said lens holder comprising:

a first ring having an outer surface from which extend resilient members;

a second ring having an outer surface upon which is provided channel means for selective securing engagement with said resilient members; and means for mounting a lens between said first and second rings;

further comprising a pair of pegs mounted diametrically opposite one another on an outside surface of one of said rings; and bearing means on said substrate holder for supporting said lens holder via said pegs.

2. A lens holder according to claim 1, further wherein said means for mounting said lens comprises a flanged step provided in at least one of said rings.

3. A lens holder according to claim 1, further wherein said channels means comprises a pair of channels lying diametrically opposite one another and extending longitudinally at approximately a 30° angle relative to a circumferential plane of said second ring.

4. A lens holder according to claim 1, further wherein said resilient members comprise wire springs, each having a first end secured to an outer surface of said first ring, and a second end bent to form a bight that extends at an angle approximately parallel to said channels.

5. A lens holder for eyeglass lenses to be coated in a high-vacuum vapor deposition or sputtering system, said holder being connectable to a substrate holder that is held in a process chamber of said high-vacuum system in the proximity of a coating source, said lens holder comprising:

a first ring having an outer surface from which extend resilient members;

a second ring having an outer surface upon which is provided channel means for selective securing engagement with said resilient members; and means for mounting a lens between said first and second rings;

further comprising a pair of pegs mounted diametrically opposite one another on an outside surface of one of said rings; and bearing means on said substrate holder for supporting said lens holder via said pegs;

further comprising a finger extending from at least one of said pegs and made from a ferromagnetic material; and magnet means arranged on said substrate holder for selectively retaining said finger, and thus said lens holder, on one of two rotational positions.

6. In a high-vacuum vapor deposition or sputtering system including a substrate older, a lens holder comprising:

a first ring pivotally attached to said substrate holder by pivot means comprising a finger extending transversely from a rotational axis of said first ring, said first ring being pivotable between first and second rotational positions;

a second ring including a step arrangement adapted to receive a lens;

at least two channel members mounted substantially diametrically opposite one another on said first ring;

at least one resilient member on said second ring, said at least one resilient member being capable of securing engagement with said channel members of said first ring; and retaining means, on said substrate holder, for selectively retaining said finger, and thus said lens holder, in one of said rotational positions.

* * * * *